United States Patent
Gaynes et al.

(10) Patent No.: US 8,269,340 B2
(45) Date of Patent: Sep. 18, 2012

(54) CURVILINEAR HEAT SPREADER/LID WITH IMPROVED HEAT DISSIPATION

(75) Inventors: Michael A. Gaynes, Vestal, NY (US); Maurice McGlashan-Powell, Mount Vernon, NY (US); Soojae Park, Wappingers Falls, NY (US); Edward Yarmchuk, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 11/857,812

(22) Filed: Sep. 19, 2007

(65) Prior Publication Data
US 2009/0072387 A1   Mar. 19, 2009

(51) Int. Cl.
*H01L 23/34* (2006.01)
*H01L 23/10* (2006.01)

(52) U.S. Cl. ............... 257/707; 257/E23.101; 257/704; 257/706; 257/712; 438/125

(58) Field of Classification Search .......... 257/E23.08, 257/701, 706, 707, 709, 712, 713, 717, 720, 257/E23.101, 704; 438/122, 125; 361/704, 361/710, 711
See application file for complete search history.

(56) References Cited

U.S. PATENT DOCUMENTS

| | | | | |
|---|---|---|---|---|
| 4,962,416 A * | 10/1990 | Jones et al. | ............ | 257/722 |
| 5,345,107 A * | 9/1994 | Daikoku et al. | ............ | 257/717 |
| 5,818,103 A * | 10/1998 | Harada | ............ | 257/676 |
| 5,825,087 A * | 10/1998 | Iruvanti et al. | ............ | 257/707 |
| 5,864,176 A * | 1/1999 | Babock et al. | ............ | 257/714 |
| 6,091,603 A | 7/2000 | Daves et al. | | |
| 6,437,438 B1 * | 8/2002 | Braasch | ............ | 257/712 |
| 6,472,762 B1 | 10/2002 | Kutlu | | |
| 6,607,942 B1 * | 8/2003 | Tsao et al. | ............ | 438/122 |
| 6,784,535 B1 | 8/2004 | Chiu | | |
| 6,830,960 B2 * | 12/2004 | Alcoe et al. | ............ | 438/122 |
| 6,831,836 B2 * | 12/2004 | Bhatia et al. | ............ | 361/705 |
| 6,933,619 B2 * | 8/2005 | Caletka et al. | ............ | 257/796 |
| 7,215,020 B2 * | 5/2007 | Nakase et al. | ............ | 257/706 |
| 7,239,517 B2 * | 7/2007 | Fitzgerald et al. | ............ | 361/704 |
| 7,268,427 B2 * | 9/2007 | Anzai | ............ | 257/707 |
| 2002/0053731 A1 * | 5/2002 | Chao et al. | ............ | 257/706 |
| 2003/0178721 A1 * | 9/2003 | Lo et al. | ............ | 257/723 |
| 2006/0128068 A1 * | 6/2006 | Murray et al. | ............ | 438/120 |
| 2006/0227510 A1 * | 10/2006 | Fitzgerald et al. | ............ | 361/704 |

* cited by examiner

*Primary Examiner* — Chris Chu
(74) *Attorney, Agent, or Firm* — Connolly Bove Lodge & Hutz LLP; Daniel P. Morris

(57) ABSTRACT

A heat spreader or lid for a microelectronic package, in which the heat spreader has an underside surface that includes at least one curvilinear contour, in which the curvilinear contour is selected from at least one positive or protruding curvilinear feature, at least one negative or recessed curvilinear feature, and a combination thereof. A microelectronic package that includes the heat spreader/lid, in which there is improved heat dissipation or reduced mechanical stress in an interface between the heat spreader/lid and a circuit chip.

13 Claims, 8 Drawing Sheets

CURVILINEAR HEAT SPREADER/LID WITH IMPROVED HEAT DISSIPATION

BACKGROUND

1. Technical Field

The disclosure relates to a heat spreader/lid, especially for microelectronic flip-chip packaging, in which the heat spreader has an underside surface that includes at least one curvilinear contour. The curvilinear contour improves the heat dissipation and mechanical stress of a thermal interface between the heat spreader or lid and the circuit chip. The disclosure also relates to a microelectronic package that includes the heat spreader/lid.

2. Discussion of the Background

Heat dissipation from a circuit chip to a heat spreader/lid is important for microelectronic packages and depends on the thermal resistance of package components. The thermal resistance is determined by the thermal conductivity, the thickness of materials and the degree of wetting at joining interfaces. The heat dissipation increases with increasing thermal conductivity and the degree of wetting, and decreasing thickness.

The major function of thermal interface materials (TIM) is to dissipate heat from the chip by thermally and mechanically linking the chip to the heat spreader. The thermal interface between the chip and the heat spreader usually has significantly smaller thermal conductivity than any other component of a microelectronic package. The thermal performance of the TIM can be improved by introducing materials with higher thermal conductivity and smaller TIM thickness. Inorganic fillers (metals and mineral oxides) are mixed with TIM gels and pastes to increase the thermal conductivity or decrease the thermal resistance of TIM. As TIM bondline decreases, the mechanical stress increases and can become a design constraint.

A soft or low-modulus TIM adhesive is preferred for flip chip plastic ball grid array (FCPBGA) packages to reduce overall mechanical stresses that are governed by the coefficient of thermal expansion (CTE) mismatched chip, underfill and organic substrate structure as shown in FIG. 1. At the same time, the TIM should be resistant to large or permanent deformations during thermal cycling that could result in crack initiation and propagation. TIM greases, which are very soft and ultra low modulus are not viable in FCPGBA packages since these materials are mobile during thermal cycling, resulting in voids and severe material loss due to the outward pumping of the paste. Consequently, effective heat dissipation is reduced and an operating chip can overheat and even fail. There is a balance that TIM thickness must achieve to satisfy both the heat dissipation and mechanical stress management requirements for chip packages.

U.S. Pat. No. 6,091,603, incorporated herein by reference in its entirety, generally discloses that thermal resistance may be reduced by introducing customized lid understructure to reduce the amount of thermally conductive material. In particular, the smaller the TIM volume, the smaller the thermal resistance. U.S. Pat. No. 6,472,762 generally discloses the use of a heat spreader with high coefficient of thermal expansion. U.S. Pat. No. 6,784,535 generally discloses a composite lid consisting of at least two materials. However, the above-mentioned disclosures do not indicate the use of curvilinear contours on a heat spreader underside to locally control the bondline for improvements to both heat dissipation and mechanical stress management in the TIM.

SUMMARY

A curvilinear surface of a heat spreader or a lid for a microelectronic package can significantly increase heat dissipation without increasing TIM stress. A curvilinear contour of the heat spreader surface can dissipate more heat by reducing local TIM thickness than a conventionally flat heat spreader. The TIM stress can be controlled and suppressed by selecting appropriate curvilinear contours of the heat spreader based on an understanding of mechanical stresses in the package.

Accordingly, one aspect of the disclosure is a microelectronic package comprising:

a substrate;
a circuit chip mounted on the substrate;
a heat spreader on the circuit chip,
wherein the heat spreader has an underside surface comprising at least one curvilinear contour;
and a thermal interface material (TIM) applied between the circuit chip and the heat spreader.

The region of highest TIM stress is right at the perimeter of the chip. This region is very susceptible to TIM failure. For this reason, there is a benefit to either increasing the TIM thickness or using a second adhesive with higher strength in this zone. Moving inward, the stress decreases and reaches a minimum. This zone is much less susceptible to failure due to the warping characteristics of FCPBA packages. For this reason, the TIM thickness in this zone can be reduced without affecting overall TIM stress.

As indicated above, the disclosure describes the use of curvilinear contours on the underside of the heat spreader. In the location where the stress in the TIM is low, a protruding or positive curvilinear feature is designed into the heat spreader surface that faces the chip to reduce the TIM bondline thickness and lower thermal resistance. In the location where the stress in the TIM is high, a recessed or negative curvilinear feature is designed into the heat spreader surface that faces the chip to increase the TIM bondline thickness and lower mechanical stress. Alternatively, a second adhesive with higher strength can be used either with or without the negative curvilinear feature.

Another aspect of the disclosure is a heat spreader or lid for a microelectronic package, wherein the heat spreader has an underside surface comprising at least one curvilinear contour, wherein the curvilinear contour selected from at least one positive or protruding curvilinear feature, at least one negative or recessed curvilinear feature, and a combination thereof.

BEST AND VARIOUS MODES FOR CARRYING OUT THE INVENTION

A more complete appreciation of the disclosure and many of the attendant advantages will be readily obtained, as the same becomes better understood by reference to the following detailed description when considered in connection with the accompanying drawings.

It should be understood that the term "curvilinear" means "appearing as a curve or nonlinear" throughout the disclosure.

It should also be understood that the terms "heat spreader" and "lid" are interchangeable terms, having the same meaning and function throughout the disclosure.

In a microelectronic package, the TIM dissipates heat from the chip as a heat conductive material. Because the thermal conductivity of the TIM is small compared to the silicon chip and metal heat spreader, it becomes the limiting path for removing heat from the chip. Thermal management and performance require optimum heat dissipation of the TIM as it is located in between the chip and the heat spreader.

Figure 1:
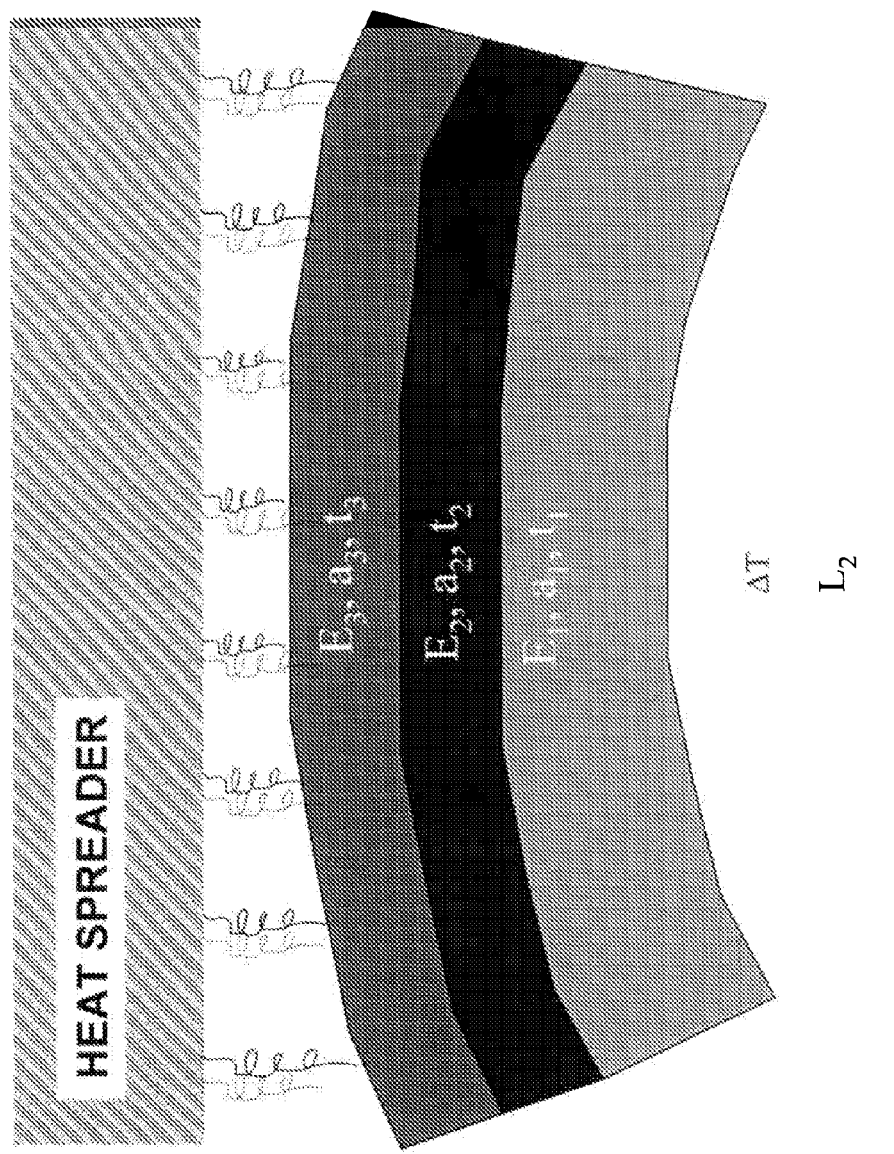
FIG. 1 shows a TIM strain/stress developed by chip/substrate warpage.
Figure 2:
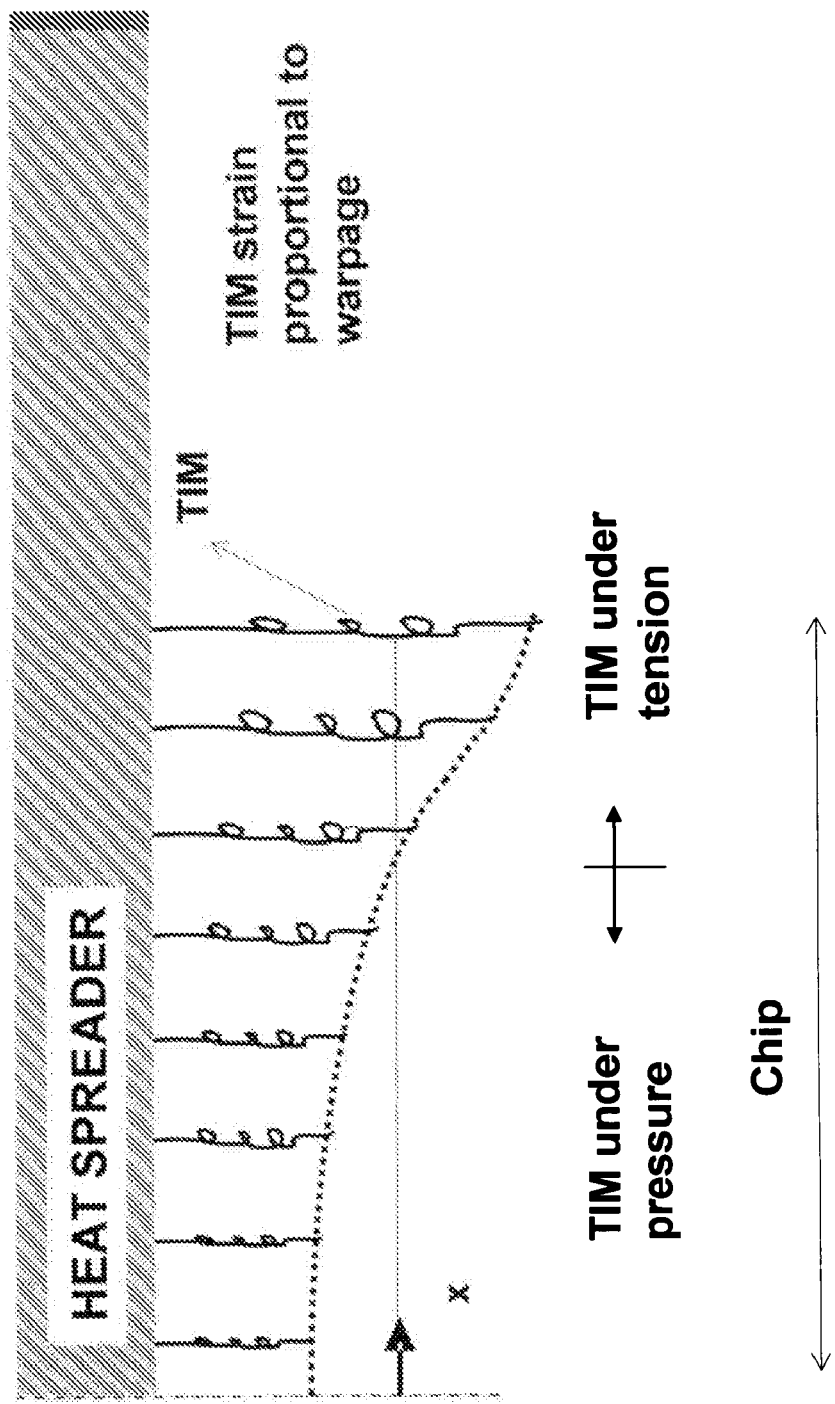
FIG. 2 shows a TIM strain/stress distribution.

In order to achieve the best heat dissipating performance, the TIM must maintain reliable mechanical contact with the chip and the heat spreader. It is the package warpage that exerts thermal stresses/strains in the TIM and that can initiate delamination or fracture, as shown in FIG. 2. However, the TIM stress distribution is not uniform over the full bonded area. Instead, local TIM stresses differ according to a chip/substrate warpage. There exists a significantly large zone where TIM stresses are negligibly small. The TIM in this zone never fails earlier than the higher stress zones. This disclosure makes use of this zone of small TIM stress to increase heat dissipation by reducing the TIM thickness.

A soft or low-modulus TIM conforms to the warpage of a chip and a substrate, and results in lower thermal stresses in the package compared to a rigid, high modulus TIM. See FIGS. 3 and 4. In particular, the figures indicate that the thinner the TIM bondline, the greater the heat dissipation and the TIM stresses. Heat dissipation improves with higher TIM thermal conductivity or thinner TIM thickness. The thinnest TIM bondline leads to the optimum heat dissipation using a fixed thermal conductivity. However, the increased stress in a thin TIM bondline leads to reliability issues such as delamination and rupture. The TIM should be strengthened or protected from large or permanent deformation induced by thermal cycling. Large deformations or strains can either catastrophically or gradually initiate cracks that propagate and lead to delamination. TIM greases can experience voiding and rupture that can cause significant reduction in heat dissipation and accelerate to overheating of the chip. Thus, the TIM thickness must be optimized to achieve a balance between the heat dissipation and the TIM stress to ensure reliable thermal performance of electronic packages.

Figure 3:
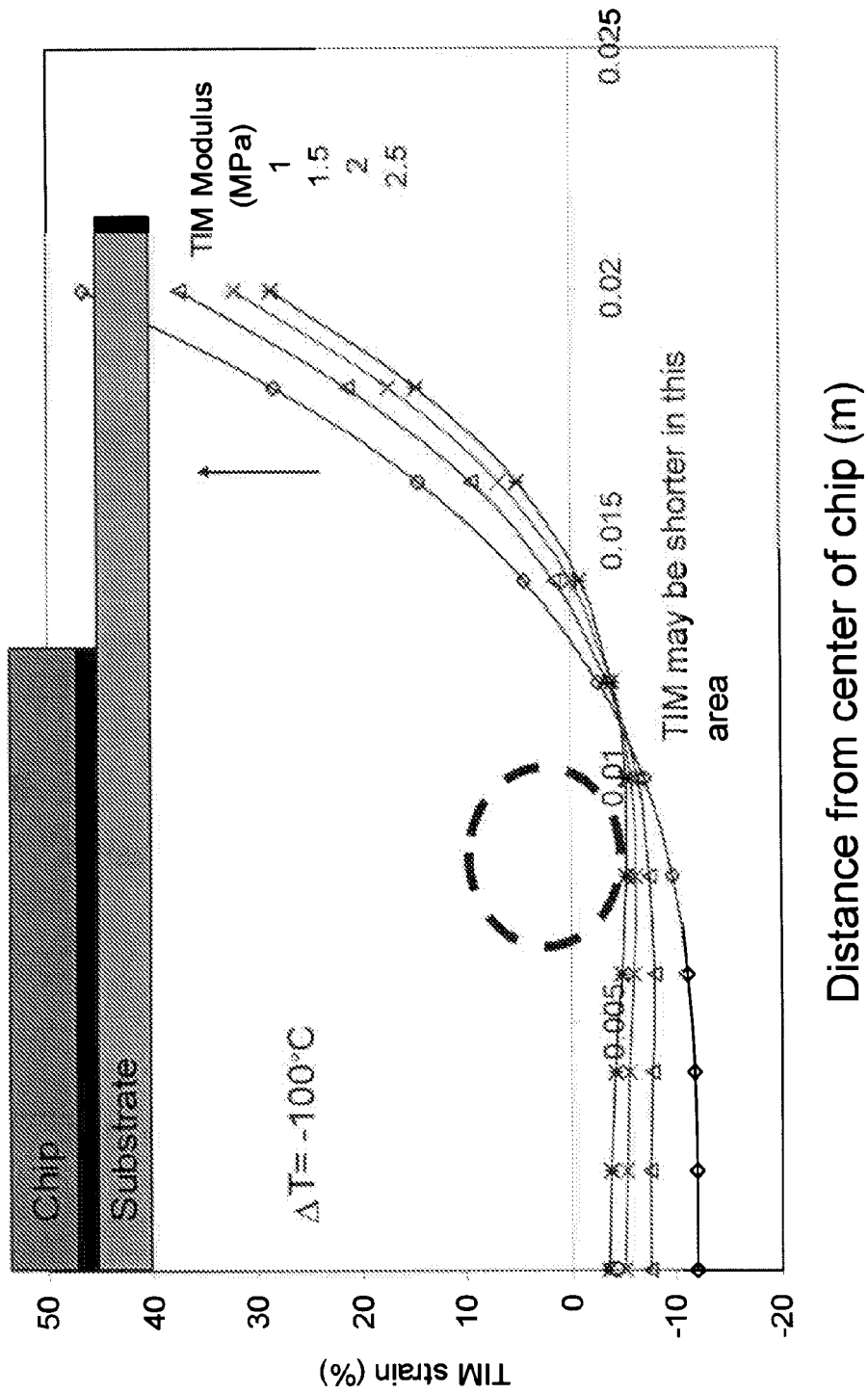
FIG. 3 shows a TIM strain over a range of small TIM modulus of 1 to 2.5 MPa, showing TIM under compression and tension, and small stress.
Figure 4:
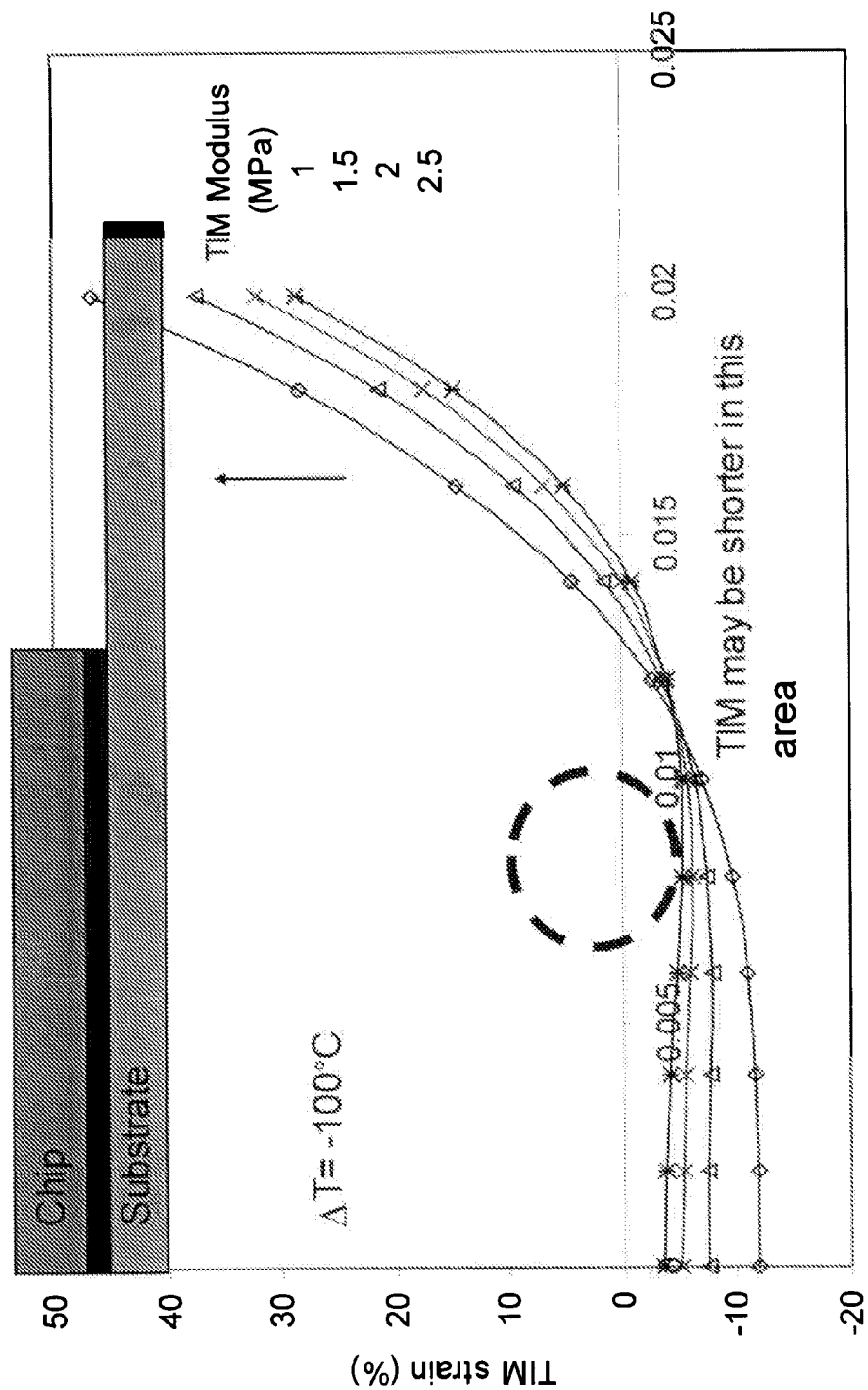
FIG. 4 shows a TIM strain over a range of intermediate TIM modulus of 10 to 25 MPa, showing a TIM under compression and tension, and a small stress zone.

A curvilinear surface on the heat spreader can significantly enhance heat dissipation through the TIM. This curvilinear contour allows a local thickness reduction in the TIM at a location where the stresses in the TIM caused by the warpage profile of a chip/substrate package are low. As a consequence, the maximum TIM stress remains the same compared to the maximum stress in the TIM for a flat heat spreader. The low-stress zone can be located by conducting advanced analytical modeling using multi-layered beams on elastic foundation. This predicts the warpage or deflection profile of the chip/substrate package mounted on the heat spreader. This model consistently predicts a curvilinear or sinusoidal contour of the warpage for a wide range of material properties and dimensions. The TIM strain distributions at four different module of TIM are shown in FIGS. 3 and 4. Non-uniform TIM strain/stress occurs all over the TIM layer. The TIM experiences compression in the middle and tension towards the chip edge in FIG. 3.

Figure 5:
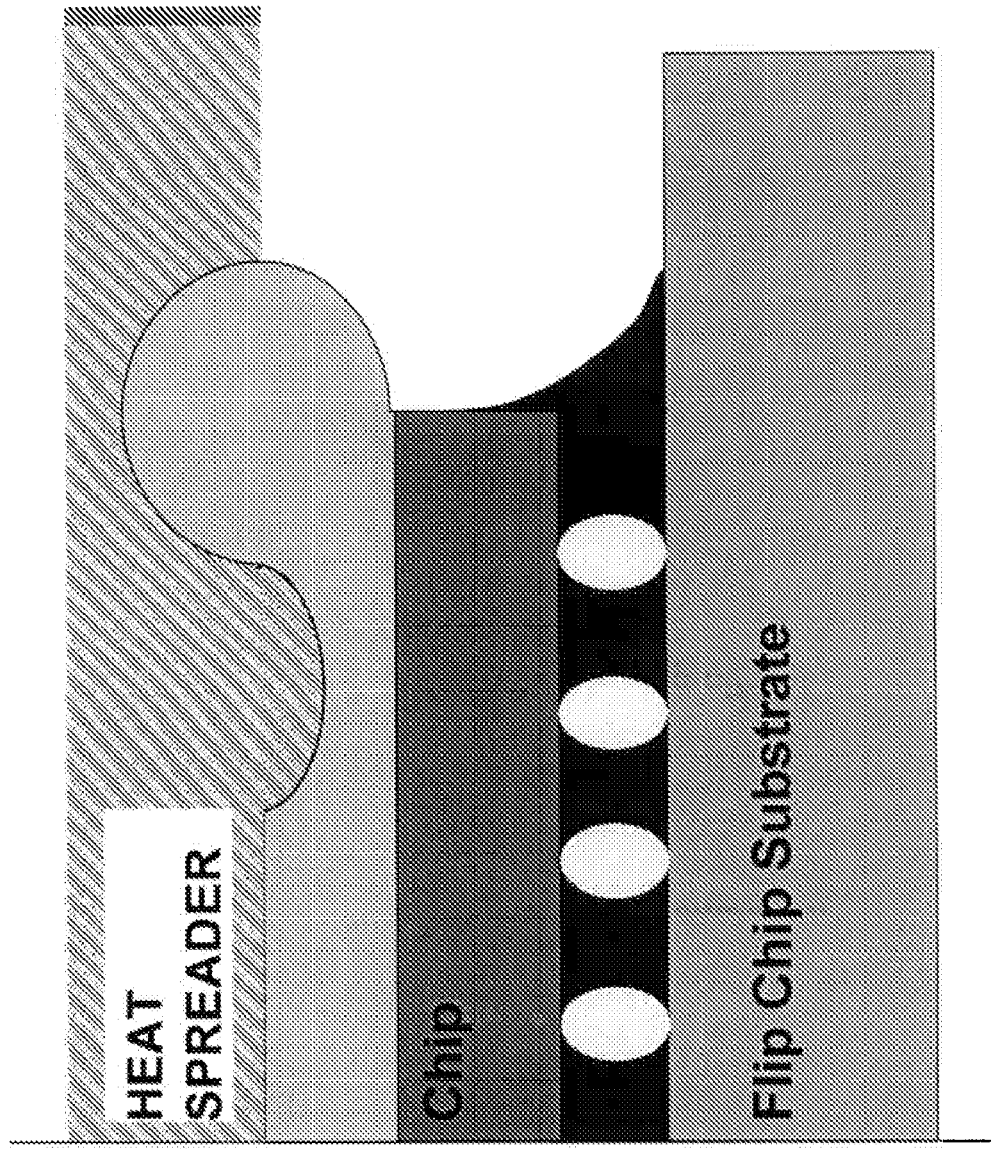
FIG. 5 shows a contour of a heat spreader/lid containing one positive and one negative curvilinear features.
Figure 6:
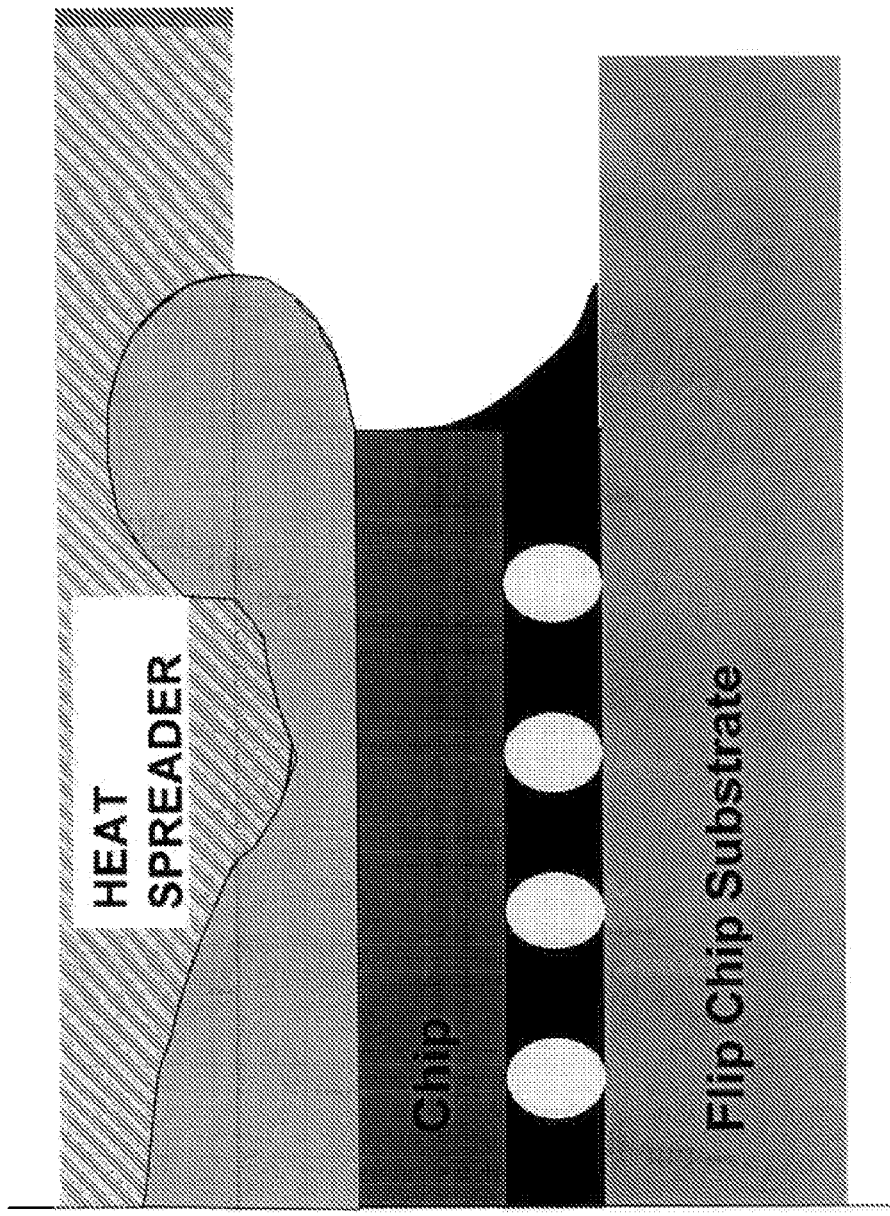
FIG. 6 shows a contour of a heat spreader/lid containing one positive and two negative curvilinear features.
Figure 7:
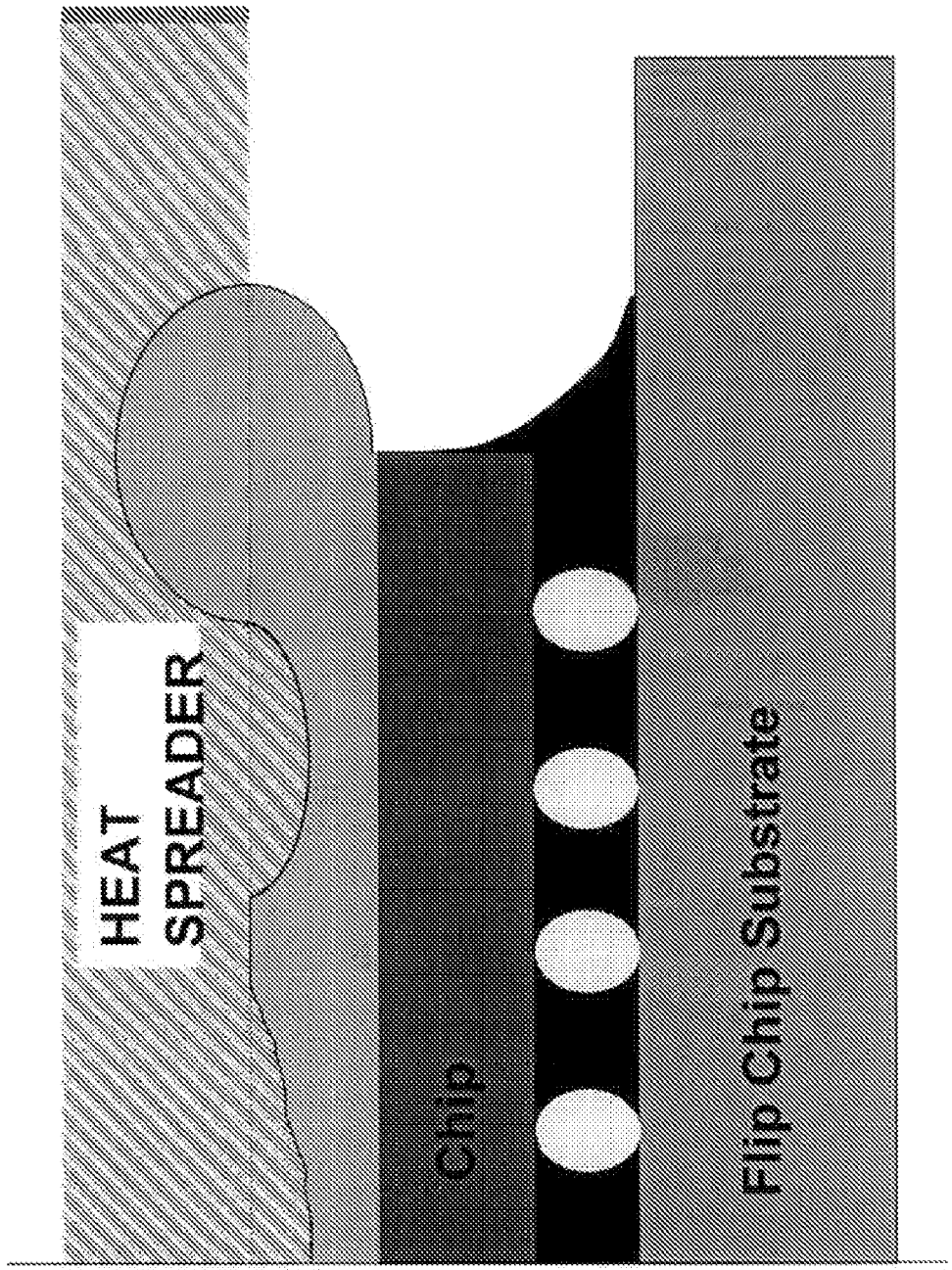
FIG. 7 shows a contour of a heat spreader/lid containing two positive and one negative curvilinear features.

The contour may include at least one positive or protruding curvilinear feature and/or at least one negative or recessed curvilinear feature. In one embodiment, the contour may include one positive or protruding curvilinear feature, and one negative or recessed curvilinear feature, as shown in FIG. 5. In another embodiment, the contour may include one positive or protruding curvilinear feature, and two negative or recessed curvilinear features, as shown in FIG. 6. In a further embodiment, the contour may include two positive or protruding curvilinear features, and one negative or recessed curvilinear feature, as show in FIG. 7.

In a preferred embodiment, the positive or protruding curvilinear feature aligns with low stress regions in the TIM between the heat spreader/lid and chip, and results in an increase in heat dissipation. The increase in heat dissipation may up to 35%, as indicated below. In another preferred embodiment, the negative or recessed curvilinear feature aligns with a high stress region in the TIM between the heat spreader/lid and circuit chip, and results in a reduction in mechanical stress. The reduction in mechanical stress may be as large as 80%. The positive or protruding curvilinear feature is located, starting 10 to 25% in from an edge of the circuit chip, and further extending inboard up to 25% of a dimension of the chip. The starting location is preferably inboard 20% from the chip edge. In addition, the positive or protruding curvilinear feature has a height up to 80% of the TIM thickness of a flat zone.

In another preferred embodiment, the negative or recessed curvilinear feature is located, starting from an edge of the chip, inboard up to 15% of a dimension of the chip. The negative or recessed curvilinear feature has a height less than or equal to 100% of the thickness of the TIM. The negative or recessed curvilinear feature may have a width of up to 15% of a dimension of the chip.

Figure 8:
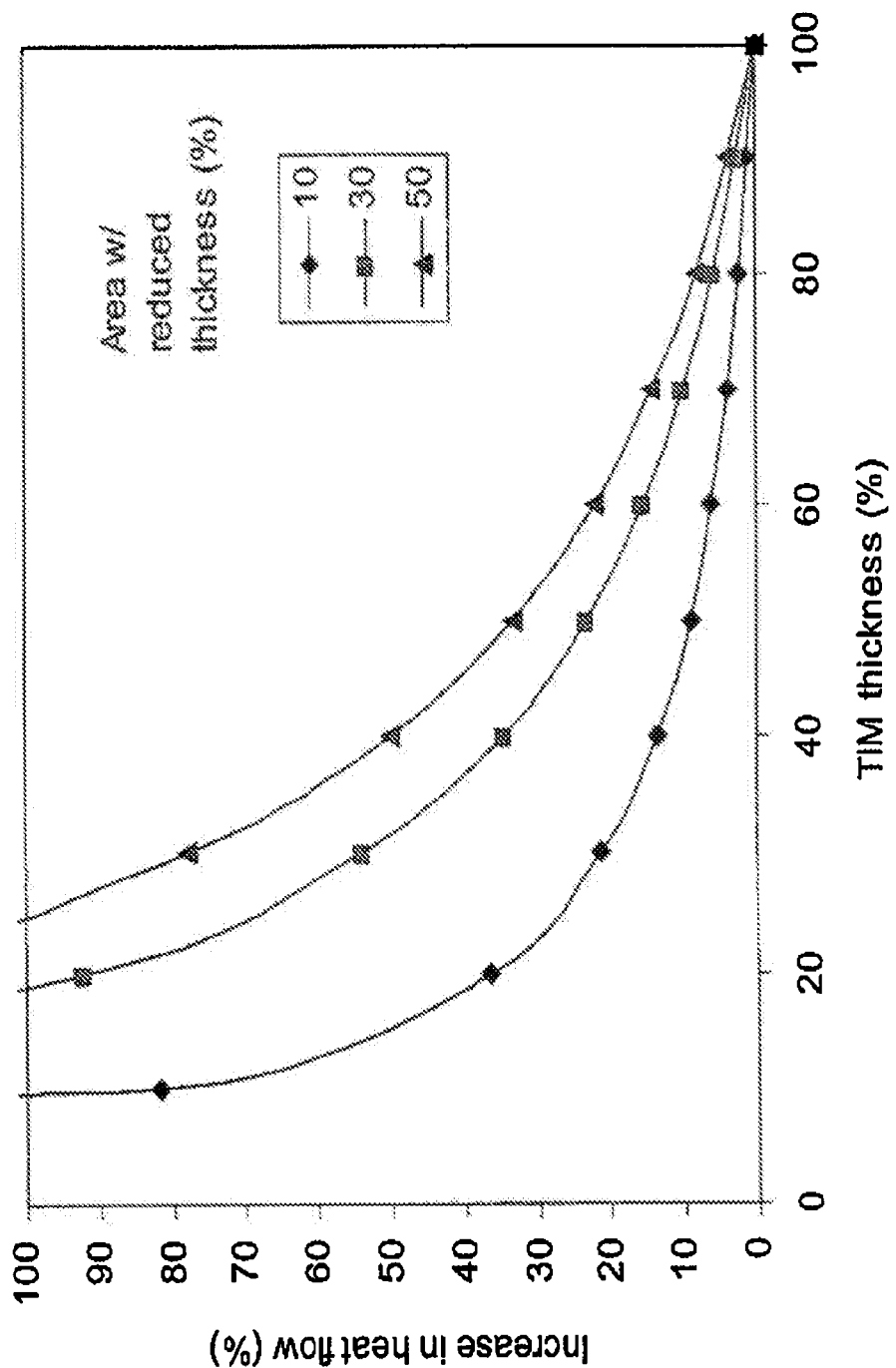
FIG. 8 shows a increase in heat dissipation by reducing TIM thickness.

By increasing the TIM thickness in the high stress zones near the chip perimeter, it is possible to significantly lower the stresses in the TIM. See FIGS. 5, 6 and 7. Alternatively, a second higher strength material could be used in these high stress zones that would not be prone to delamination or fracture. It should be understood that there exists a zone in the TIM layer where TIM strains are negligibly small. The TIM in this zone does not experience high thermal strain/stress, and subsequently, no voiding/rupture occurs. This indicates a thinner TIM thickness may be used in this zone to improve the thermal performance of the package. The potential improvement of heat dissipation is calculated as a function of TIM thickness using the heat conduction theory in FIG. 8. For example, the reduced TIM thickness of 40%, over 30% of the total chip area, can increase the heat flow or dissipation by 35%. There is a potential for additional improvement by reducing the local TIM thickness even more.

One of the advantages of this invention is that no extra assembly step is required. The same assembly process can be used except for a curvilinearly contoured heat spreader. For manufacturing simplicity, grinding, stamping or coining can be used to place a curvilinear contour on the heat spreader surface.

Obviously, numerous modifications and variations of the disclosure are possible in light of the above disclosure. It is therefore understood that within the scope of the appended claims, the disclosure may be practiced otherwise than as specifically described herein.

What is claimed is:

1. A microelectronic package comprising:
   a substrate;
   a circuit chip mounted on the substrate;
   a heat spreader/lid on the circuit chip, wherein the heat spreader has an underside surface comprising at least one curvilinear contour;

and a thermal interface material (TIM) applied between the circuit chip and the heat spreader/lid, wherein the curvilinear contour comprises one positive or protruding curvilinear feature, and one negative or recessed curvilinear feature, wherein the positive or protruding curvilinear feature aligns with low stress regions in the TIM between the heat spreader/lid and circuit chip, and results in an increase in heat dissipation, wherein the negative or recessed curvilinear feature aligns with a high stress region in the TIM between the heat spreader/lid and circuit chip, and results in a reduction in mechanical stress.

2. The microelectronic package according to claim 1, wherein the contour comprises one positive or protruding curvilinear feature, and two negative or recessed curvilinear features.

3. The microelectronic package according to claim 1, wherein the contour comprises two positive or protruding curvilinear features, and one negative or recessed curvilinear feature.

4. The microelectronic package according to claim 1, wherein the increase in heat dissipation is 35%.

5. The microelectronic package according to claim 1, wherein the reduction in mechanical stress is 80%.

6. The microelectronic package according to claim 1, wherein the at least one positive or protruding curvilinear feature is located, starting 10 to 25% in from an edge of the circuit chip, and further extending inboard up to 25% of a dimension of the chip.

7. The microelectronic package according to claim 6, wherein the starting location is inboard 20% from the chip edge.

8. The microelectronic package according to claim 6, wherein the positive or protruding curvilinear feature has a height up to 80% of the TIM thickness.

9. The microelectronic package according to claim 1, wherein the at least one negative or recessed curvilinear feature is located, starting from an edge of the chip, inboard up to 15% of a dimension of the chip.

10. The microelectronic package according to claim 9, wherein the negative or recessed curvilinear feature has a height less than or equal to 100% of the thickness of the TIM.

11. The microelectronic package according to claim 9, wherein the negative or recessed curvilinear feature has a width of up to 15% of a dimension of the chip.

12. The microelectronic package according to claim 1, wherein the microelectronic package is a flip chip microelectronic package or a flip chip plastic ball grid array (FCPBGA) package.

13. A microelectronic package comprising:
a substrate;
a circuit chip mounted on the substrate;
a heat spreader/lid on the circuit chip,
wherein the heat spreader has an underside surface comprising at least one curvilinear contour;
and a thermal interface material (TIM) applied between the circuit chip and the heat spreader/lid,
wherein the curvilinear contour comprises one positive or protruding curvilinear feature, and one negative or recessed curvilinear feature,
wherein the positive or protruding curvilinear feature aligns with low stress regions in the TIM between the heat spreader/lid and circuit chip, and results in an increase in heat dissipation,
wherein the negative or recessed curvilinear feature aligns with a high stress region in the TIM between the heat spreader/lid and circuit chip, and results in a reduction in mechanical stress,
wherein the at least one positive or protruding curvilinear feature is located, starting 10 to 25% in from an edge of the circuit chip, and further extending inboard up to 25% of a dimension of the chip, and
wherein the at least one negative or recessed curvilinear feature is located, starting from an edge of the chip, inboard up to 15% of a dimension of the chip.

* * * * *